United States Patent
Cavaliere et al.

(10) Patent No.: US 9,966,976 B2
(45) Date of Patent: May 8, 2018

(54) ADAPTATION OF FORWARD ERROR CORRECTION CODE AND/OR MODULATION

(71) Applicant: Telefonaktiebolaget L M Ericsson (publ), Stockholm (SE)

(72) Inventors: Fabio Cavaliere, Pisa (IT); Stefano Chinnici, Milan (IT); Philip Nibbs, Melbourne (AU)

(73) Assignee: Telafonaktiebolaget LM Ericsson (publ), Stockholm (SE)

( * ) Notice: Subject to any disclaimer, the term of this patent is extended or adjusted under 35 U.S.C. 154(b) by 0 days. days.

(21) Appl. No.: 14/907,710

(22) PCT Filed: Aug. 9, 2013

(86) PCT No.: PCT/EP2013/066757
§ 371 (c)(1),
(2) Date: Jan. 26, 2016

(87) PCT Pub. No.: WO2015/018460
PCT Pub. Date: Feb. 12, 2015

(65) Prior Publication Data
US 2016/0164544 A1 Jun. 9, 2016

(51) Int. Cl.
*H03M 13/35* (2006.01)
*H04B 10/61* (2013.01)
(Continued)

(52) U.S. Cl.
CPC ...... *H03M 13/353* (2013.01); *H04B 10/2543* (2013.01); *H04B 10/616* (2013.01);
(Continued)

(58) Field of Classification Search
CPC ............. H03M 13/353; H04B 10/2543; H04B 10/616; H04L 1/0003; H04L 1/0009;
(Continued)

(56) References Cited

U.S. PATENT DOCUMENTS

| | | | | |
|---|---|---|---|---|
| 8,724,485 B2* | 5/2014 | Kliger | ................. | H04L 12/2803 370/252 |
| 2002/0058505 A1* | 5/2002 | Kim | ..................... | H04L 1/0003 455/427 |

(Continued)

OTHER PUBLICATIONS

Gwang-Hyun, et al. "Rate-Adaptive Coding for Optical Fiber Transmission Systems," Journal of Lightwave Technology, vol. 29: 222-233, Jan. 15, 2011.*

(Continued)

Primary Examiner — Kyle Vallecillo
(74) Attorney, Agent, or Firm — Baker Botts, LLP

(57) ABSTRACT

A receiver (1) is configured to receive an optical transmission, wherein the receiver is configured to determine a plurality of values over time of the quality of the optical transmission. The receiver comprises one or more low pass filter (26) configured to low pass filter the values of quality of the transmission. Based on the low pass filtered values, the receiver (1) is configured to determine a FEC code and/or modulation type for a further optical transmission.

19 Claims, 6 Drawing Sheets

(51) Int. Cl.
*H04B 10/2543* (2013.01)
*H04L 1/00* (2006.01)
*H04L 1/20* (2006.01)
*H04L 27/34* (2006.01)

(52) U.S. Cl.
CPC .......... *H04L 1/0003* (2013.01); *H04L 1/0009* (2013.01); *H04L 1/0019* (2013.01); *H04L 1/0036* (2013.01); *H04L 1/0042* (2013.01); *H04L 1/0045* (2013.01); *H04L 1/203* (2013.01); *H04L 27/34* (2013.01)

(58) Field of Classification Search
CPC ... H04L 1/0019; H04L 1/0036; H04L 1/0042; H04L 1/0045; H04L 1/203; H04L 27/34
See application file for complete search history.

(56) References Cited

U.S. PATENT DOCUMENTS

| | | |
|---|---|---|
| 2004/0028159 A1 | 2/2004 | Abdelilah et al. |
| 2010/0316380 A1 | 12/2010 | de Lind van Wijngaarden et al. |
| 2012/0039618 A1* | 2/2012 | Mamyshev ............ H04B 10/69 398/208 |
| 2012/0251102 A1* | 10/2012 | Terayama .......... H04B 10/6932 398/25 |

OTHER PUBLICATIONS

Casting 1 Tb/s DP-QPSK Communication into 200 GHz Bandwidth by L. Poti et al., 2012.
Rate-Adaptive Coding for Optical Fiber Transmission Systems by Gwang-Hyun Gho et al.; Journal of Lightwave Technology, vol. 29, No. 2, Jan. 15, 2011.
Rate-Adaptive Modulation and Coding for Optical Fiber Transmission Systems by Gwang- Hyun Gho et al.; Journal of Lightwave Technology vol. 30, No. 12, Jun. 15, 2012.
International Search Report for International application No. PCT/EP2013/066757, dated Dec. 18, 2013.

* cited by examiner

ADAPTATION OF FORWARD ERROR CORRECTION CODE AND/OR MODULATION

PRIORITY

This nonprovisional application is a U.S. National Stage Filing under 35 U.S.C. § 371 of International Patent Application Serial No. PCT/EP2013/066757, filed Aug. 9, 2013, and entitled "Adaptation of Forward Error Correction Code and/or Modulation".

TECHNICAL FIELD

Aspects of the invention relate to a receiver, system and method for adapting a Forward Error Correction (FEC) code and/or modulation type for an optical transmission.

BACKGROUND

Forward Error Correction is a powerful tool that allows telecommunications systems to increase the transmission distance reach with a minimal increase of cost. State of the art FEC algorithms are able to tolerate input bit error rate (BER) values equal or higher than $10^{-2}$. Depending on the modulation format used, this may correspond to almost 10 dB improved signal-to-noise ratio tolerance. As an example, in a 1600 km optical fiber link with 20×80 km amplified spans and 0.22 dB/km fiber attenuation coefficient, 10 dB of optical signal-to-noise ratio (OSNR) variation corresponds to 900 km of additional link distance, boosting the total distance to 2500 km.

It is known to use different FECs in optical transmission to deal with different propagation conditions, for example, from L. Poti, G. Meloni, G. Berrettini, F. Fresi, M. Secondini, T. Foggi, G. Colavolpe, E. Forestieri, A. D'Errico, F. Cavaliere, R. Sabella, and G. Prati, "Casting 1 Tb/s DP-QPSK Communication into 200 GHz Bandwidth," ECOC'12, Amsterdam, NL, 2012, paper P4.19.

The possibility to change the FEC type is known from G. Gho and J. M. Khan, "Rate-adaptive modulation and coding for optical fiber transmission systems", J. Lightw. Tech., vol. 30, no. 12, pp. 1818-1828, June 2012.

Powerful FEC algorithms, able to work with low OSNR and high input BER values, can increase the outage probability if the propagation conditions are worse than expected or change during the system life. Numerous factors can affect the propagation conditions. If the OSNR is high, a powerful FEC may be used, with the disadvantage of a relatively low quantity of data payload that can be carried. The FEC selected needs to be sufficient for the OSNR, whilst maximising the payload.

In addition, the transmission over the optical fiber may suffer from non-linear effects.

Current systems are not able to distinguish what factors are primarily affecting the performance, and so a sub-optimal error correction strategy may be used.

SUMMARY

A first aspect of the present invention provides a receiver configured to receive an optical transmission. The receiver is configured to determine a plurality of values over time of the quality of the optical transmission. The receiver comprising one or more low pass filter configured to low pass filter the values of quality of the transmission. Based on the low pass filtered values, the receiver is configured to determine a FEC code and/or modulation type for a further optical transmission.

The configuration of the receiver allows for only slow variations of transmission quality to be considered when determining a change in FEC code and/or modulation type.

Optionally, the low pass filter is configured to filter out variations of quality of the transmission which occur faster than a threshold time.

Optionally, the receiver is configured to determine non-linear effects on the optical transmission, the receiver is configured to determine a FEC code and/or modulation type for a further optical transmission based at least partially on the determined non-linear effects.

A second aspect of the present invention provides a method of adapting a FEC code and/or modulation type for an optical transmission. The method comprises receiving an optical transmission and determining a plurality of values over time of the quality of the optical transmission. The method further comprises low pass filtering the values of quality of the transmission, and based on the low pass filtered values, determining a FEC code and/or modulation type for a further optical transmission.

A third aspect of the present invention provides a system comprising a transmitter and receiver of an optical transmission. The receiver is configured to receive an optical transmission. The receiver is configured to determine a plurality of values over time of the quality of the optical transmission. The receiver comprises one or more low pass filter configured to low pass filter the values of quality of the transmission. Based on the low pass filtered values, the receiver is configured to transmit a signal to the transmitter of the optical transmission, the signal requesting the determined FEC code and/or modulation type for further transmissions.

A fourth aspect of the present invention provides a computer program product arranged, when run on a computer, to carry out the method according to any example of the invention.

BRIEF DESCRIPTION OF THE DRAWINGS

Embodiments of the invention will be described, by way of example only, with reference to the accompanying drawings, in which.

DETAILED DESCRIPTION

Figure 1:
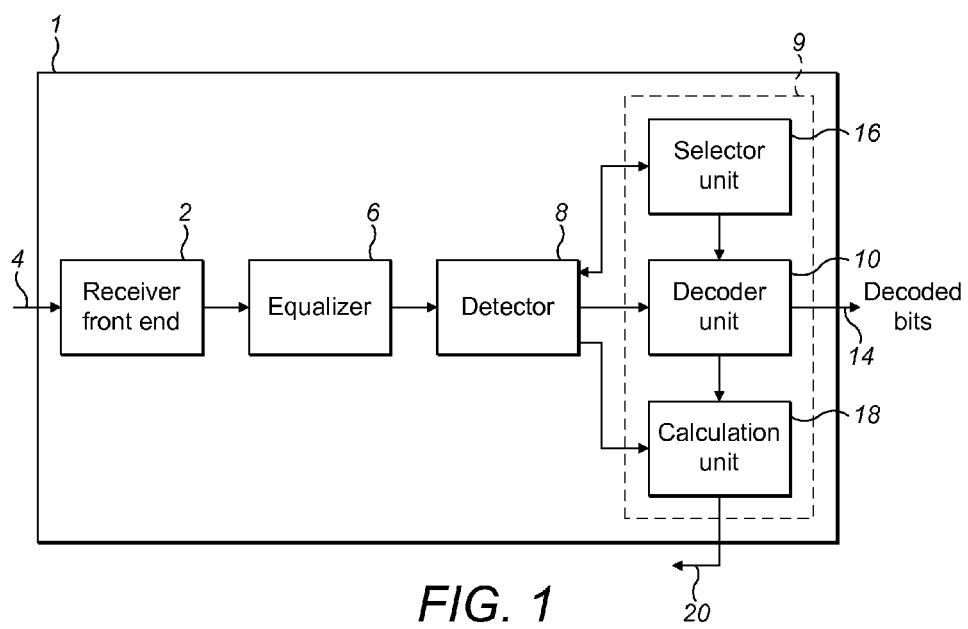
FIG. 1 shows a receiver according to an example of the invention.

FIG. 1 shows an exemplary receiver 1 configured to receive an optical communications transmission, e.g. over an optical fiber. The receiver 1 comprises a front end 2 configured to receive the transmission over the communications link 4.

The front end 2 of the receiver 1 is an optical front end, for example, comprising a local oscillator and polarization splitting means.

The front end 2 is connected to an equalizer 6. The equalizer 6 may be a feed forward equalizer. The initial stages of the receiver 1 may be as in a common coherent receiver. An output of the equalizer 6 is connected to a detector 8.

The detector 8 is a symbol detector configured to detect symbols of the transmission. In some examples, the detector 8 is a trellis detector. For example, the detector is a Viterbi or Bahl, Cocke, Jelinek and Raviv (BCJR) detector. Such examples of trellis detector are known, and so are not described in further detail. In some aspects, the symbol detector 8 is a maximum a posteriori symbol detector. The output of the detector 8 corresponds to bits, or alternatively, corresponds to transmitted symbols.

In some examples, the detector is configured to detect a plurality of different modulation types.

An output of the detector 8 is connected to an adaptive decoder module 9. The adaptive decoder module comprises a decoder unit 10, selector unit 16 and calculation unit 18. The units 10, 16, 18 are functional units, which are defined by function for convenience. Any of the modules or units described may be implemented together or separately, in software, firmware or hardware.

An output of the detector 8 is connected to the decoder unit 10. The decoder unit 10 is a forward error correction (FEC) decoder unit configured to decode the FEC coded transmission. The FEC decoder unit 10 may be of any type, and examples are described below. The FEC decoder unit 10 is configured to decode data using one of a plurality of FEC codes. The plurality of FEC codes have different FEC code rates and/or different FEC types. The different FEC types may or may not be rate-compatible. The plurality of FEC codes can be implemented by using a single FEC type with selectable code rate, and possibly in a rate-compatible fashion, or by different FEC types. The FEC code may be any FEC code, for example, a Low Density Parity Check (LDPC) code, Turbo code, Raptor code. In some examples, the different FEC type is a combination of FEC codes. For example, a combination of a LDPC and Reed-Solomon (RS) code. In some examples the FEC code has a selectable rate and/or is a rate-compatible code. The decoder unit 10 outputs the final decoded transmission as output 14.

The FEC decoder unit can operate directly on the transmitted symbols or it can operate on bits. In some examples, the detector includes a specific function which transforms the symbols to bits, or, in the case of a soft decision FEC, the symbol error probabilities into bit error probabilities, which are then processed by the (binary) FEC decoder.

In some examples, an output of the decoder unit 10 is connected to the detector 8, in order to iteratively detect and decode the transmission. As is known, iteration messages are passed from the decoder 10 to the detector 8, to provide for improved detection of the symbols. The detection and decoding steps are performed a plurality of times, using iteratively updated information. This arrangement is known as a Turbo receiver.

The receiver 1 further comprises a selector unit 16. The selector unit 16 is configured to select one of a plurality N of FEC codes for the FEC decoder unit 10 to use in the decoding operation. In some examples, the selector unit 16 selects a different modulation type.

In some examples, the selector unit 16 determines the selected FEC code and/or modulation type from signalling from another network entity, in particular, from the transmitter of the transmission. For example, the signalling is in-band signalling. The use of in-band signalling allows a selected message to be sent together with the payload data block to be processed, or before a predetermined numbers of data blocks. The signalling comprises a variable identifying the FEC code and/or modulation type to be used with the associated data in the transmission. In an example, the selector unit 16 receives the signalling from the detector 8. Alternatively, the selector unit 16 is connected to any part of the receiver, or separately to the transmission, to receive the signalling.

In a further example, the selector unit 16 is configured to select the FEC code and/or modulation based on out-of-band signalling. Alternatively, the selector unit 16 does not select the FEC and/or modulation based on signalling from the transmitter. For example, the selector unit 16 selects the FEC and/or modulation based on a pre-configured arrangement based on a request for a new FEC and/or modulation, e.g. a pre-determined time after a different FEC and/or modulation was requested, or from a local determination of the FEC and/or modulation used in the transmission.

The selector unit 16 is configured to inform the FEC decoder unit 10 of the FEC code used, so that the FEC decoder unit 10 can decode or detect the transmission based on that FEC code. The selector unit 16 is configured to inform the detector 8 of the modulation type used so that the detector 8 can detect the transmission based on that modulation.

The receiver 1 further comprises a calculation unit 18. The calculation unit 18 is configured to determine if the FEC code and/or a modulation used by the transmission should be changed. In some examples, the calculation unit 18 determines a new FEC code and/or modulation which should be used for further transmission.

In some examples, the calculation unit 18 monitors one or more parameters of transmission quality, e.g. bit error rate (BER), SNR, system margin, error vector magnitude (EVM), number of uncorrected errors, or a related property of the transmission. The calculation unit 18 may measure a parameter which is related to or can be used to calculate a transmission quality, an example of which is described below.

In some aspects, the calculation unit 18 is configured to determine the one or more parameters of transmission quality by monitoring one or more monitoring points. The one or more monitoring points are in the receiver 1.

For example, the calculation unit 18 is configured to monitor the decoder unit 10 to determine the one or more parameters of transmission quality. In some examples, the calculation unit 18 receives one or more parameters of transmission quality by monitoring the transmission prior to the FEC decoder unit 10, e.g. after the detector 8. Alternatively, the calculation unit 18 receives one or more parameters of transmission quality from one or more monitoring points, e.g. from the detector 8, from any part of the receiver 1, or from the transmission prior to the receiver 1.

Based on the one or more parameters of transmission quality, the calculation unit 18 determines if a different FEC code and/or modulation is optimal to meet criteria for ensuring a reliable transmission which has a minimal waste of capacity.

The calculation unit 18 is configured to output a signal 20 indicating that a different FEC code and/or modulation should be used. In some example, the output signal 20 from the calculation unit 18 is sent to the transmitter of the transmission. The transmitter is then able to send subsequent communications using the selected different FEC code and/or modulation.

A change in modulation may be any suitable change due to a change in transmission quality and/or non-linear effects. For example, the modulation is changed from 16 Quadrature amplitude modulation (16 QAM) to 16 Amplitude and phase-shift keying (16 APSK). For example, on detection of non-linear effects (described in more detail below), the change is to any modulation with the same spectral efficiency and higher robustness to non-linear effects. In yet another example, one or more of code type, code rate and modulation are changed in response to a variation of channel conditions.

Figure 2:
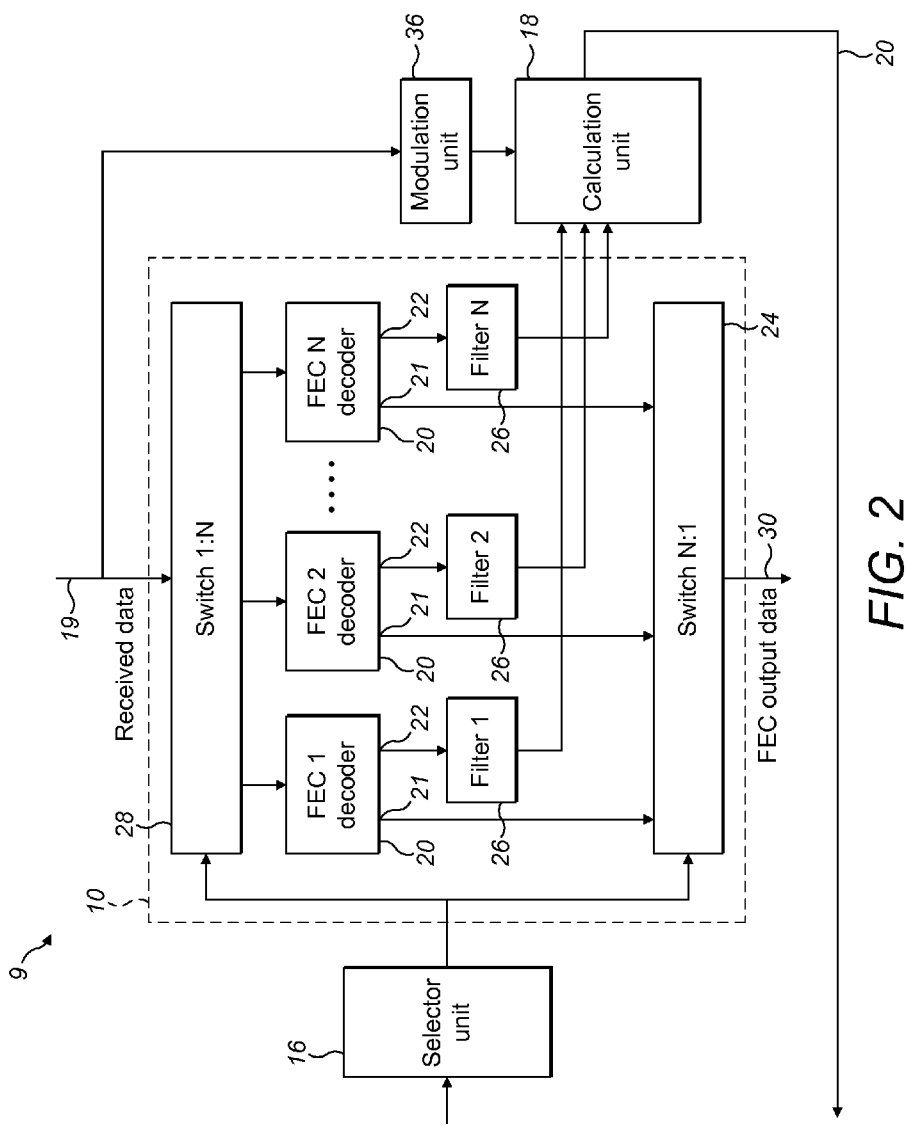
FIG. 2 shows a schematic view of a part of the receiver according to an example of the invention.

FIG. 2 shows the adaptive decoder module 9 of the receiver for a communications system, as described above. In particular, the receiver is configured to receive an optical transmission. The adaptive decoder module 9 is configured to receive detected bits or symbols from the detector. The adaptive decoder module 9 according to an example of the invention is configured to decode the transmission using the FEC code of the transmission. In addition, the adaptive decoder module 9 is configured to determine a FEC for further transmissions.

In the example shown, the FEC decoder unit 10 comprises a plurality of FEC decoders 20 to handle the plurality of FEC codes. Each FEC decoder 20 handles one FEC code. At any given time, only one of the FEC decoders 20 is active in decoding. Alternatively, a single FEC decoder handles a plurality of FEC codes.

The FEC decoders receive detected bits or symbols from the detector 8, on a connection 19. The transmission data is distributed to the plurality of FEC decoders 20, for example, with a switch 1:N 28.

The FEC decoders have a first output 21 and a second output 22. The first outputs 21 are the decoded bits, which are collated by a N:1 switch 24. The switch 24 comprises a single output 30 for decoded bits, which are output from the FEC decoder unit 10.

The selector unit 16 is configured to select a decoder or a configuration of a decoder to decode the current FEC code. The selector unit 16 is connected to the 1:N switch 28 and N:1 switch 24. The selector unit 16 is configured to control the switches 24, 28 to select one of the plurality of FEC decoders 20 to decode the transmission.

The second outputs 22 from the FEC decoders 20 are used to calculate one or more parameters of the transmission quality. In particular, the second output 22 provides a parameter indicating transmission quality, for example, BER, SNR, system margin, EVM or a related property of the transmission. The parameter indicating transmission quality is determined or sampled at a pre-determined rate. The parameter indicating transmission quality is time-varying.

The parameter indicating transmission quality is not used directly to determine if a different FEC code and/or modulation should be used. Instead, the parameter indicating transmission quality is processed such that only relatively slow variations of transmission quality trigger a different FEC code and/or modulation type.

For example, the attenuation of a fiber span could increase due to cable aging, thermal variations or mechanical stress caused by road works, unstable soil or humidity seepage that can freeze overnight. These factors may affect one or more parameters indicating transmission quality. At least some of these factors are specific to fibre optic cables, and at least some may not be appreciated as issues which can benefit from a different FEC code and/or modulation type. Aspects of the present invention are configured to handle such relatively slow changes to the transmission quality. The receiver 1 according to an example of the invention is configured to only consider a variation in transmission quality due to a relatively slow change. Considering only slow variations of the propagation channel ensures stable operation.

Slow variation effects can be caused by cable parameter fluctuations following a change of the environmental conditions. For examples, fibre cables installed on grid pylons that are sensitive to heat and wind may result in changes in transmission quality and/or non-linear effects as the atmospheric conditions changes. In a further example, cables (e.g. fiber optic cables) buried in the ground may be affected by the soil changing in density due to temperature variations, increasing the pressure on the cable. The temperature variations may be due to a 24 hour (i.e. day-night) variation. This is particularly significant in a country such as Australia, and is also the case in any country with high variations in temperature.

Note that fast events that lead to a change of the steady state conditions are also selected (i.e. not excluded) by the low pass filter. For example, this is the case for an amplifier that unexpectedly increases its output power, e.g. due to a failure of the power control circuitry. The initial change may occur rapidly, but the sustained change can be considered as a low frequency component, which is not excluded by the low pass filter.

In some aspects, the time-varying parameter of transmission quality can be considered as comprising components of different frequencies. The parameter components having a frequency above a threshold can be considered as high frequency or fast components, and the parameter components having a frequency below a threshold can be considered as low frequency or slow components. Aspects of the invention are arranged to base a change in FEC code and/or modulation only on the low frequency components. In particular, if the value of the low frequency components of the parameter are above a magnitude threshold or below a further magnitude threshold, then a different FEC code and/or modulation is selected.

In aspects of the invention, fast variations of the parameter of transmission quality are handled differently to slow variations. In particular, an action when a parameter of transmission quality is higher or lower than pre-determined thresholds is based on whether the parameter is associated with a slow or fast variation, i.e. is a low or high frequency component.

The receiver is configured such that when a parameter of transmission quality beyond a threshold is associated with a slow variation, i.e. is a low frequency component, then the FEC code and/or modulation may be changed, as described in more detail below.

The receiver is configured such that when a parameter of transmission quality beyond a threshold is associated with a fast variation, i.e. is a high frequency component, then the FEC code and modulation are not changed. The fast variations in the transmission quality, e.g. due to polarization scrambling, are absorbed by the system margins or compensated for by one or more different mechanisms, e.g. by the equalizer 6 of the receiver 1.

In an example of the invention, the receiver effectively determines whether the variations in the transmission quality are fast or slow (i.e. have frequency components above or below a threshold). Only slow variations are handled with a change of FEC code and/or modulation, if the slow variations parameter has a value which triggers such a change.

For example, if the slowly varying parameter of transmission quality is beyond a threshold. If the slowly varying component of the parameter of transmission quality is not beyond a threshold, the receiver determines that the current FEC code and/or modulation is correct, and no change is required. Values of the fast varying component of the parameter of transmission quality are filtered out or do not trigger a change in FEC code and/or modulation.

In some aspects, the fast and slow variations are defined by components of the parameter of the transmission quality which are faster or slower than a cut-off frequency. The cut-off frequency is related to a time, e.g. an effective time, time window or threshold time.

The threshold time determines which variations occur over a longer or shorter time, corresponding to slower or faster variations. A low pass filter 26 is configured to filter out variations which occur over a shorter time than the threshold time. In some examples, the low pass filter 26 will most effectively filter out variations over a time which is substantially shorter than the threshold time, e.g. an order of magnitude shorter.

In some examples, the threshold time is based on the round-trip time of the transmission between the transmitter and receiver 1. This is the time taken by a transmission to travel from the transmitter to the receiver, and back to the transmitter. For an example 2000 km fiber link, the round-trip time would be approximately 0.02 s. For example, the threshold time is the round-trip time. In some examples, the threshold time (e.g. the length of the time window used) is greater than the round-trip time. Aspects of the present invention only consider variations which occur over a longer duration than the round trip time.

The round trip time can be either estimated from information, e.g. during the planning phase, or measured, e.g. during the installation or following channel re-routing.

In other examples, the threshold time is based on a pre-determined time, independent of the round trip time. For example, the threshold time is greater than 0.01 s, 0.1 s, or 1 s. Alternatively, the threshold time is greater than 1 minute, greater than 10 minutes, or greater than 1 hour. In some examples, the threshold time is in the range of between 0.002 s and 10 s, or between 0.005 s and 5 s, or between 0.01 s and 1 s, or between 1 s and 1 hour, or between 1 minute and 1 hour, or between 1 minute and 10 minutes. The threshold time may be above, below or between any time(s) mentioned. The threshold time is set such that the FEC code and/or modulation is detected relatively promptly for a slow variation in the transmission quality.

The receiver 1 is configured to isolate relatively slow variations which require a changed FEC and/or modulation, minimising the number of FEC and/or modulation changes which are needed. The FEC code and/or modulation are optimised for the channel conditions. The threshold time is set such that the FEC code and/or modulation is changed relatively promptly on detection of a slow variation in the transmission quality.

The receiver 1 is configured to filter the parameter of the transmission quality. In particular, one or more filters 26 operate on the parameter of the transmission quality. In some aspects, the filters 26 are low pass filters. The low pass filters 26 are configured to exclude high frequency components of the parameter of the transmission quality, and pass only the low frequency components. The threshold frequency or time is set by the filter property, e.g. cut-off frequency, of the low pass filter. The averaging window of the low pass filter is set equal or comparable to this effective time for which events are considered.

In the example shown, an output of the one or more low pass filters 26 are connected to an input of the calculation unit 18. Thus, the calculation unit 18 receives the low pass filtered parameter of transmission quality. In a further aspect, the one or more low pass filters 24 are considered as part of the calculation unit 18.

In some examples, a separate low pass filter 26 is connected to each of the FEC decoders 20, e.g. at the second output 22. Alternatively, a single low pass filter can receive a parameter of transmission quality from a plurality (or all) of the decoders 20.

The low pass filter 26 may be constructed in any suitable manner, for example, implemented using a moving average of the parameter of transmission quality. The parameter of transmission quality is averaged over a time, i.e. a plurality of values of the parameter received in the last time period are averaged. The moving average may be considered as an averaging window. The averaging window is equal or of the same order of length as the threshold time.

The filters 26 are configured to receive a value which relates to a parameter of transmission quality, e.g. OSNR or BER of the transmission. In some examples, the transmission quality is determined by a FEC decoder. For example, the transmission quality is determined from a FEC decoder carrying out an iterative operation. The transmission quality is determined from the number of iterations required. A decoder requiring a relatively large number of iterations indicates a relatively low transmission quality, and a decoder requiring a relatively low number of iterations indicates a relatively high transmission quality. The number of iterations is for an iterative decoder or for a Turbo receiver iteratively exchanging information between a decoder and symbol detector.

A number of iterations is output from the decoder and used as the parameter of transmission quality, or converted into the parameter of transmission quality using a pre-determined relationship (e.g. using a look-up table). Alternatively, a number of failed parity checks in a Low Density Parity Check (LDPC) decoder is used instead of the number of iterations. Further details are described in co-pending application PCT/EP2013/060654. Alternatively, any known method or technique may be used to determine the transmission quality.

Alternatively, one or more filter receives a measure of the transmission quality from a different part of the receiver. For example, the one or more low pass filter receives a measure of the transmission quality from prior to the FEC decoders.

The calculation unit 18 is configured to receive an input from a modulation unit 36. The modulation unit 36 is configured to output to the calculation unit 18 an indication of non-linearities on received modulation symbols.

The indication of non-linearities can be computed by considering a predetermined number of received symbols and computing centroid and variance for each constellation point. The symbols analysed are any symbols of the transmission or symbols of one or more a training sequence sent periodically. The training sequences may sent, for example, every minute or hour, since the effects being compensated for are slowly varying).

The modulation unit 36 is configured to receive symbols of the transmission. The symbols may be from a symbol output of the detector 8 (as shown with a connection to input 19), or alternatively, symbols from prior to the detector 8. In some examples, the modulation unit 36 takes as input both an output from the detector and the received symbols prior to the detector. Combining both inputs may lead to an improved estimate of the conditions in which the FEC is operating. The output from the detector may be soft information and symbols.

Figure 3:
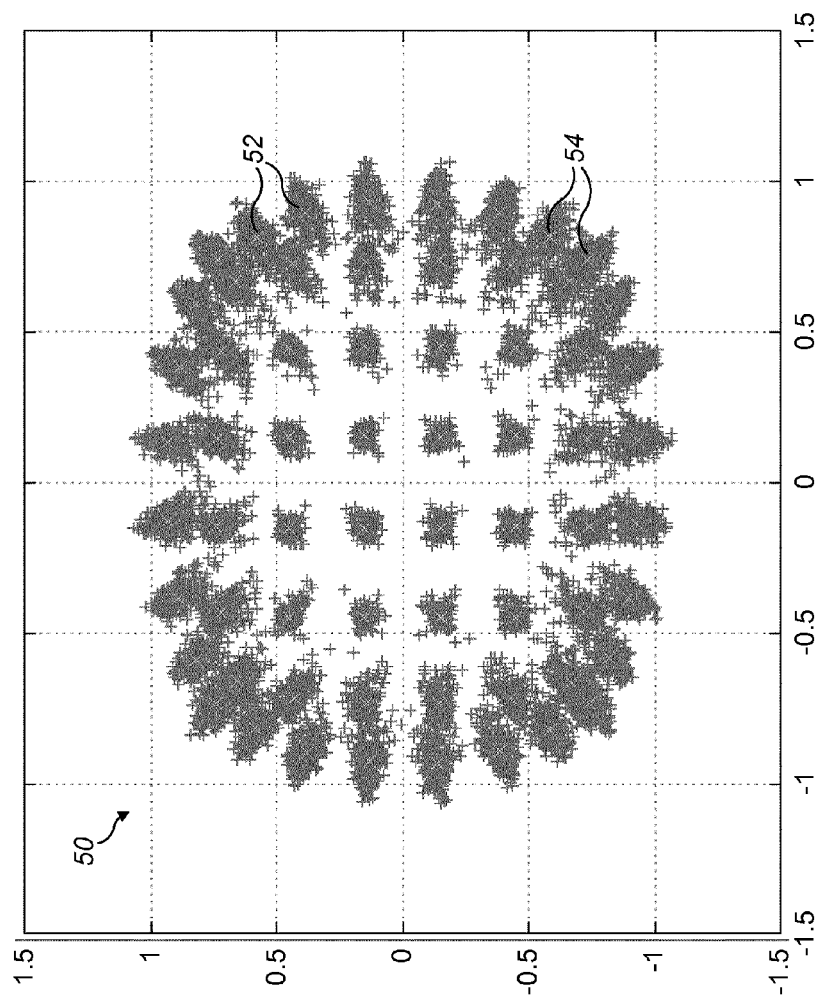
FIG. 3 shows a modulation constellation affected by a non-linear effect.

FIG. 3 shows an example modulation constellation distorted by non-linear effects, which mainly affect outer symbols. In this case, the constellation is a Quadrature amplitude modulation (QAM) constellation. The example constellation 50 is affected by Additive white Gaussian noise (AWGN). The constellation 50 comprises a plurality of constellation points 52.

A centroid $c_i$ for a given constellation point, indicated by a cross 54, can be mathematically computed as:

$$c_i = c(s_i) = E\{R_k | S_k = s_i\}$$

In these equations, i is the generic constellation point index, $c_i$ is the centroid of the given constellation point, which is a function of the transmitted point $s_i$, the operator $E\{.\}$ indicates a statistical average, $R_k$ is the received point, $S_k$ is the transmitted point, the index k spans all the constellation points.

This expression indicates that the centroid for a given constellation point is the statistical average over a sequence of received points, conditioned to the transmitted point being a certain point $s_i$.

The associated variance a is given by:

$$\sigma_i^2 = \frac{1}{2} E\{|R_k - c_i|^2 \mid S_k = s_i\}$$

In this equation, $\sigma_i$ is the variance of the centroid resulting from a given constellation point, and the further symbols are as described above.

This expression indicates that the variance for a given constellation point is the statistical average of the difference between the received point and the centroid over a sequence of received points, conditioned to the transmitted point being a certain point $s_i$.

The variances $\sigma_i$ associated to each constellation point can be averaged in the modulation block 36 over the complete set of received symbols in a measurement interval to derive a single measurement $\sigma$, which is then fed to the calculation unit 18. The variance is used to indicate a non-linear effect, or alternatively or in addition is used to indicate the presence of noise.

The calculation unit 18 is arranged to determine non-linear effects based on the measured variance. For example, non-linear effects are identified when different values of variance for inner and outer symbols are received. A further indication of non-linear effects are indicated by the different values of variance along orthogonal directions, e.g. of the in-phase quadrature (IQ) plane. In some examples, the directions are the radial and azimuthal directions. For example, non-linear effects are indicated by a difference above a threshold of values of variance along the radial and azimuthal directions. The calculation unit 18 may determine non-linear effects are present if different values of variance along the radial and azimuthal directions for outer symbols are measured. For example, non-linear effects are indicated when the variance of the outer symbols along the radial and azimuthal directions is above a threshold.

The variances in the radial (rad) and azimuthal (az) directions are indicated by:

$$\sigma_{i-rad}^2 = \frac{1}{2} E\{[(R_k - c_i) \cdot \gamma_i]^2 \mid S_k = s_i\}$$

$$\sigma_{i-az}^2 = \frac{1}{2} E\{[(R_k - c_i) \cdot \tau_i]^2 \mid S_k = s_i\}$$

where $\gamma$ and $\tau$ are unit vectors parallel and orthogonal to the centroid vector.

The determined centroid is used to calculate the variance. In some examples, the centroid is also used to detect the non-linear distortion, given the a-priori knowledge of the transmitted constellation. One or both of the centroid and variance provide an indication of the channel conditions, and are passed to the calculation unit 18.

One or more of the output of the modulation block are low-pass filtered prior to use by the calculation unit 18, e.g. low pass filtered in the modulation block or calculation unit 18. Alternatively, the one or more of the output of the modulation block are not low pass filtered.

The non-linear effects may at least partially be due to fiber parameter values, for example, chromatic dispersion, Raman and attenuation coefficients spectra, which are different than estimated. Alternatively, a non-linear effect may be due to an amplifier not working properly.

In some example, non-linear effects can become important when an optical channel is routed through a ROADM towards a longer path, and the non-linear effect is higher than expected at the planning phase, e.g. because of the cable parameter tolerances. In a further example, a failure of an optical amplifier, ROADM or group of channels can increase the power of the surviving channels. If the link design is correct, the channels continue to work but with reduced margin.

Based on the measurements of the variance, the modulation unit 36 or calculation unit 18 determines an amount of non-linear effects on the received symbols. A value indicating the amount of non-linear effects is used as an input to an algorithm of the calculation unit 18 determining the FEC code and/or modulation. A further input to the algorithm determining the FEC code and/or modulation is the time averaged parameter of the transmission quality, e.g. from the decoders 20.

The variance is used to estimate an amount of non-linearity. Radial and azimuthal variances provide an estimation of the symbol constellation asymmetry, which is an indicator of the presence of nonlinear effects.

The calculation unit 18 is configured such that a measured high amount of non-linear effects (e.g. above a threshold) triggers the use of a different FEC or an interleaved code, e.g. to prevent errors bursts caused by bit-pattern dependence. The calculation unit 18 is configured to determine that the resulting increased latency from using an interleaved code provides an overall advantage.

In some examples, when non-linear effects become important with respect to additive white Gaussian noise (AWGN) or other noise sources, the calculation unit 18 is configured to switch the FEC code to counteract the effect of correlated bit errors. For example, switch the FEC code from a binary LDPC code to a Reed-Solomon code.

In some examples, the modulation block 36 provides a determination of transmission quality. In some examples, this is based on the determined variance. This is in addition to, or instead of, the transmission quality from the FEC decoders. For example, the calculation 18 receives separate indications from the decoder and the modulation unit 36 of the transmission quality. These indications may be combined, weighted, or one discarded if not considered accurate. For example, in the presence of non-linearity and/or phase noise the soft information of the decoded bits may become correlated, and the decoder is mismatched to the channel, so the decoder error correction capability is degraded.

A single value to determine the required FEC code can be computed from the parameter of transmission quality. In some examples, the parameter of transmission quality is weighted. In one example, the parameter of transmission quality is weighted with a weight based on the determined non-linearity of the received transmission. In some aspects, the weights are multiplicative factors based on the output of the modulation block 36. The weight multiplies the BER (simple multiplicative factor). The weight is selected based on the determined non-linearity. In some examples, the calculation unit 18 is configured to generate a single value, $\hat{y}$, for determining the FEC code to be used. The single value may be a real number. The single value is based on the output from the modulation unit 18 (e.g. non-linearity value) and the transmission quality (e.g. from the low pass filters).

$$\hat{y} = \sum_{n=1}^{N} w_n(s) \cdot x_n$$

$x_n$ is the low pass filtered transmission quality,
s is the output of the modulation block 18
$w_n(\cdot)$ are weight functions In this example, the single value is a sum of all the N FEC decoders 20. Only the active FEC decoders will contribute to the output $\hat{y}$, and the non-active FEC decoders will contribute zero. Alternatively, only the one or more active FEC decoders provides a measurement of transmission quality which is used to determine the FEC code and/or modulation.

In some examples, the weight functions depend on the used FECs, modulation format and/or implementation.

The value $\hat{y}$ can be compared with one or more thresholds to choose a FEC code. For example, the value $\hat{y}$ is compared with one or more thresholds to determine which of the N FEC codes is used.

In some examples, the FEC codes comprise a first group of one or more FEC codes to be selected when non-linear effects are not detected, and a second group of one or more FEC codes to be selected when non-linear effects are detected. The values of the weights indicating non-linear effects and values of the low pass filtered parameter of transmission quality are selected such that a FEC code from the first group is selected when non-linear effects are not detected, and from the second group when non-linear effects are detected. For example, the N FEC codes are arranged in an order of the first group followed by the second group. A weight indicating no non-linear effect has a value (e.g. low value) providing for selection within the first group according to the parameter of transmission quality. A weight indicating an amount of non-linear effects has a value (e.g. high value) providing for selection within the second group, optionally also according to the parameter of transmission quality.

The amount of non-linear effects and/or the parameter of transmission quality are used as inputs by the calculation unit 18. The calculation unit 18 is configured such that a measured high amount of optical noise results in a more powerful FEC code, i.e. the FEC code is changed to a different FEC code with a decreased code rate and coding gain or a different FEC type. For example, the parameter of transmission quality is compared to a threshold, and is determined to be above (beyond) the threshold. In some examples, the transmission quality is weighted by the non-linearity, e.g. defined as $\hat{y}$ above, is compared to the threshold.

The calculation unit 18 is configured to determine that the resulting decreased payload from using a lower code rate or different FEC type provides an overall advantage, e.g. reduces the number of uncorrected errors to below a threshold.

The calculation unit 18 is also configured to determine if the parameter of transmission quality, optionally weighted based on the non-linearity (e.g. $\hat{y}$), indicates a low noise which allows a less powerful FEC code. For example, the FEC code is changed to a different FEC code with an increased code rate and coding gain or a different FEC type. The parameter of transmission quality, optionally weighted based on the non-linearity, may be compared with a further threshold to determine if the less powerful FEC code and/or modulation may be used.

Alternatively, the inputs to the calculation unit from the low pass filters are combined using a linear or non-linear function of the filtered values. For example, instead of multiplication with a weight, any generic function may be used.

Each value of low pass filtered parameter of transmission quality, optionally including a non-linearity component, has one associated FEC code. For a varying parameter of transmission quality, optionally including an amount of non-linearity as defined above, an assigned number of FEC code varies from 1 to N. As the low pass filtered parameter of transmission quality, optionally including a non-linearity component varies through a threshold, the FEC code is changed to the next numbered FEC code. In some examples, the FEC code can be considered as determined using a step function. Showing the parameter of transmission quality, optionally including an amount of non-linearity, along a horizontal axis, and the FEC codes on the vertical axis, the selectable FEC codes are shown as a series of steps, e.g. increasing steps. The parameter of transmission quality, optionally including an amount of non-linearity, directly determines the FEC code. The FEC code may be determined using a look-up table containing values of the function.

The calculation unit 18 determines a single value from the low pass filtered FEC decoders and modulation unit 36. The single value obtained is sent to a threshold function, i.e. compared with a threshold.

In a further example, the output of the threshold function indicates a normal value, e.g. 0, when the corresponding FEC is not used or the number of uncorrected errors is low. The threshold function indicates a change value, e.g. 1, when a threshold value, determined by design and depending only on the FEC type in use, is exceeded. On detection of the change value, a separate function determines the new FEC code and/or modulation.

In some examples, the calculation unit 18 calculates whether a change needs to be made for one or each of the FEC decoders. In some aspects, only one FEC decoder is active at any time. In a general case, a weighted sum is calculated for all the FEC decoders, even if only one is active. For example, in the weighted sum performed by the calculation unit 18 only one input is different from zero. In some aspects, all the FEC decoders are active even if just one is finally selected. In this case the 1:N switch 28 is a 1:N splitter.

The calculation unit 18 is configured to counteract non-linear effects in one or more ways: switching to a FEC code which is better able to handle the presence of correlated errors, decreasing the FEC code rate, increasing the amount of interleaving, adapting the computation of a soft decision in the detector 8 to the estimated value of the non-linearity, and non-linear effects compensation in the receiver (described below). Any or all of these changes may be used in combination together. Changes to the FEC code may be determined as above. Other changes to counteract non-linear effects may be separately triggered on detection of non-linear effects, e.g. the amount of non-linear effects reaching a threshold.

A receiver according to an example of the invention is configured for non-linear effects compensation. The compensation is carried out as part of the signal processing of the received transmission, for example, by a digital signal processor (DSP). In some examples, this processing is part of the equalizer 6. The equalizer 6 comprises a non-linear equalization element. The non-linear equalization element is realised as a non-linear phase rotator (NLPR). The non-linear equalization element has the effect of rotating the phase of the input signal by an amount to compensate for the non-linearity. In an example, such a non-linear equalization element is configured to be active in compensating for non-linear effects, or in an inactive state. The non-linear equalization element consumes power, and so the inactive state allows a reduction in power consumption. The calculation unit 18 or modulation block 36 is configured to control whether the non-linear equalization element is active or in an inactive state according to whether the non-linear effects, e.g. calculated from the variance, are below or above a threshold respectively.

In some examples two (or more) different FEC codes can be used at the transmitter, providing additional error protection at the expense of spectral efficiency. In this implementation, under the assumption that the two FEC codes are systematic, the transmitter will send the message symbols followed by the redundant symbols from FEC code 1 and FEC code 2. At the receiver, after de-multiplexing, the two FEC decoders can operate in parallel on received data.

The calculation unit 18 is configured to determine which FEC code and/or modulation to use in the event of the threshold being exceeded for each of the FEC codes and modulations. For example, the calculation unit comprises a look-up table of the FEC codes and modulations as an input, and configured to output changed FEC codes and modulations as an output.

The calculation unit 18 further generates an indicator of which FEC code and/or modulation should be used. This may be a different FEC code and/or modulation, or the same. The calculation unit 18 outputs this indicator to the transmitter, for subsequent transmissions. For example, the calculation unit 18 outputs a number, e.g. integer number between 1 and N, indicating which of the FEC decoders to use.

In some examples, the calculation unit is configured to determine a change in the modulation type, as an alternative or in addition to changing the FEC code. In some aspects, the modulation type may be changed by changing the number of symbols used. For example, if the quality of the transmission is considered to be below a threshold value, a constellation with fewer symbols is used. Alternatively, if the quality of transmission is above a threshold value, more symbols are used (if possible). Alternatively, a different attribute of the modulation is changed, increasing the transmission rate of the payload if allowed by a high quality of transmission, or improving the quality of transmission if required. For example, the modulation format may be changed, e.g. from QAM to Quadrature phase-shift keying (QPSK).

Aspects of the present invention allow in service and real time adaptation of the traffic payload in an optical channel, depending on the actual propagation conditions. By optical channel monitoring, a transmission quality parameter (e.g. SNR) and/or non-linear effects are determined to adapt the optical transmission. The adaptation is of particular use in a high speed optical transmission.

Examples of the present invention allow a system to compensate for slow performance degradations, adopting different error compensation strategies for linear and non-linear effects acting on the system. The procedure is not traffic affecting and leads to a minimal waste of capacity in case of link degradation. The proposed invention is applicable to adaptive coding and modulation systems, i.e. changing the FEC does not preclude the possibility to also or alternatively change the modulation format.

Figure 4:
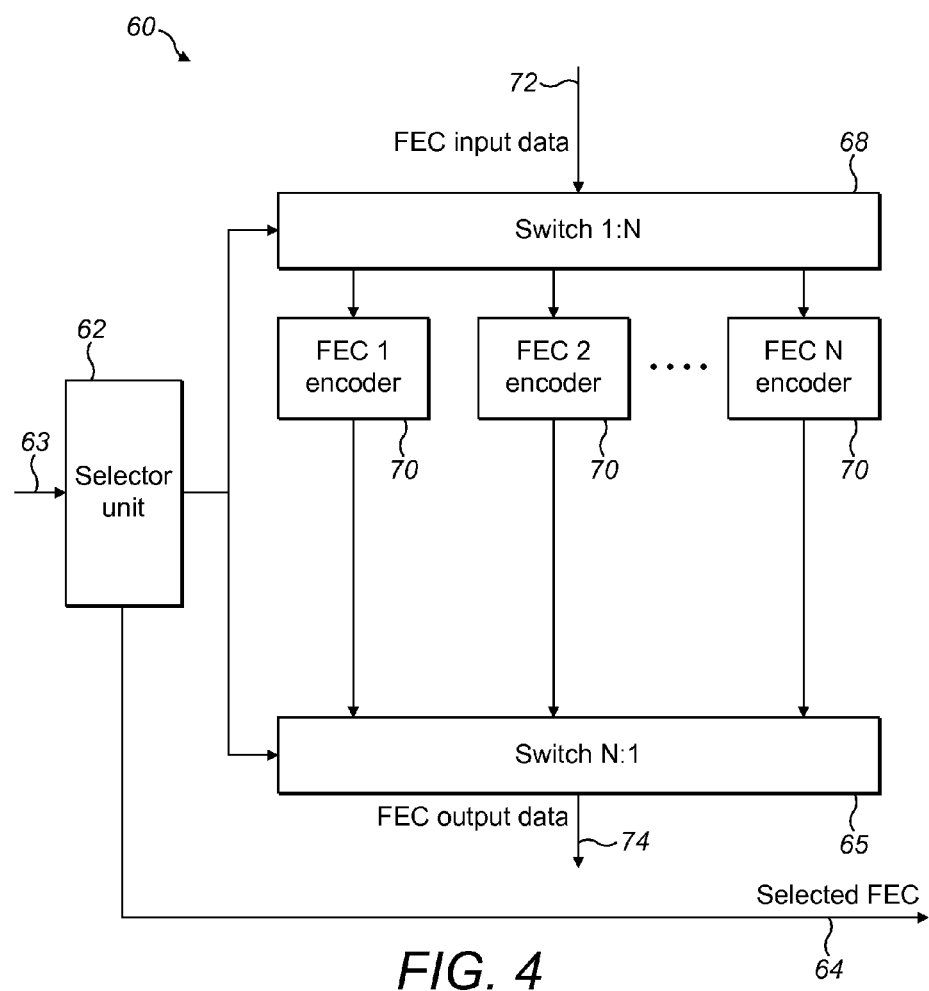
FIG. 4 shows a schematic view of a part of a transmitter according to an example of the invention.

FIG. 4 shows an example transmitter 60, configured for use with the receiver 1 as described above. The transmitter 60 is configured to use a FEC on the transmission. A handshake mechanism between the transmitter and the receiver allows a change in service of the type of FEC. The transmitter is configured receive a FEC code selection and/or modulation type selection from the receiver 1. The FEC code and/or modulation type used by the transmitter is as selected by the receiver 1.

The transmitter 60 comprises a selector unit 62 configured to receive an identification 63 (from signal 20) of a selected FEC code and/or modulation type from the receiver 1. The identification is transmitted at a pre-determined intervals or only when a change is requested. The selector unit 62 is configured to transmit a signal 64 from the receiver 1 with the selected FEC code and/or modulation type, as described above.

The selector unit 62 is configured to select the FEC code used, according to the received identification 63 of the FEC from the receiver 1. In one example, the transmission can be encoded using one of a plurality of FEC encoders 70. In this example, there are N FEC encoders 70. The FEC encoder 70 used is selected by a 1:N switch 68, configured to pass a transmission 72 to be encoded to the selected FEC encoder 70 for FEC encoding. A N:1 switch 65 is configured to combine the outputs from the FEC encoders to provide a single transmission output 74. The switches 65, 68 are controlled by the selector unit 62.

In some aspects, the selector unit 62 or other part of the transmitter is configured to receive an identification of a changed modulation type. The selected modulation is implemented by the transmitter.

The proposed invention provides compensation for slow performance degradations, adopting different error compensation strategies for linear and non-linear effects acting on the system. The procedure is not traffic affecting and lead to a minimal waste of capacity in case of link degradation. The proposed invention is applicable to adaptive coding and modulation systems, i.e. it does not preclude the possibility to change also the modulation format.

A further aspect of the invention is a system comprising a transmitter and receiver, as described in any example. A further aspect is a computer program or computer program product arranged, when run on a computer, to carry out any example of the method described.

In some examples, the receiver and/or transmitter comprise one or more processors. The one or more processor is configured to carry out the functions as described above, e.g. of the calculation unit, FEC decoder, selector unit or modulation unit. The receiver and transmitter may comprise one or more memory or storage accessible by the processor. Any of the components or units described may be implemented together or separately with one or more processors and/or memory.

Figure 5:
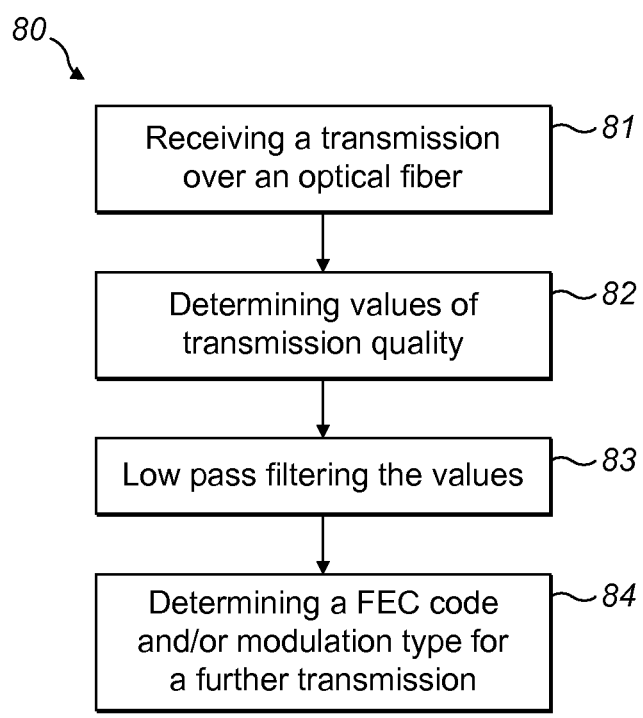
FIG. 5 is a flowchart showing a method according to an example of the invention.

FIG. 5 shows an example method 80 according to an example of the invention. The method 80 is for adapting a FEC code and/or modulation type for an optical transmission. The method comprises receiving an optical transmission, e.g. over an optical fiber, in 81. The method further comprises determining a plurality of values over time of the quality of the optical transmission, in 82. The determining is carried out in a receiver, as described above, for example, from a FEC decoder. The method further includes low pass filtering the values of quality of the transmission, in 83. The low pass filtering may be with a moving average. Based on the low pass filtered values, the method includes determining a FEC code and/or modulation type for a further optical transmission, in 84.

Figure 6:
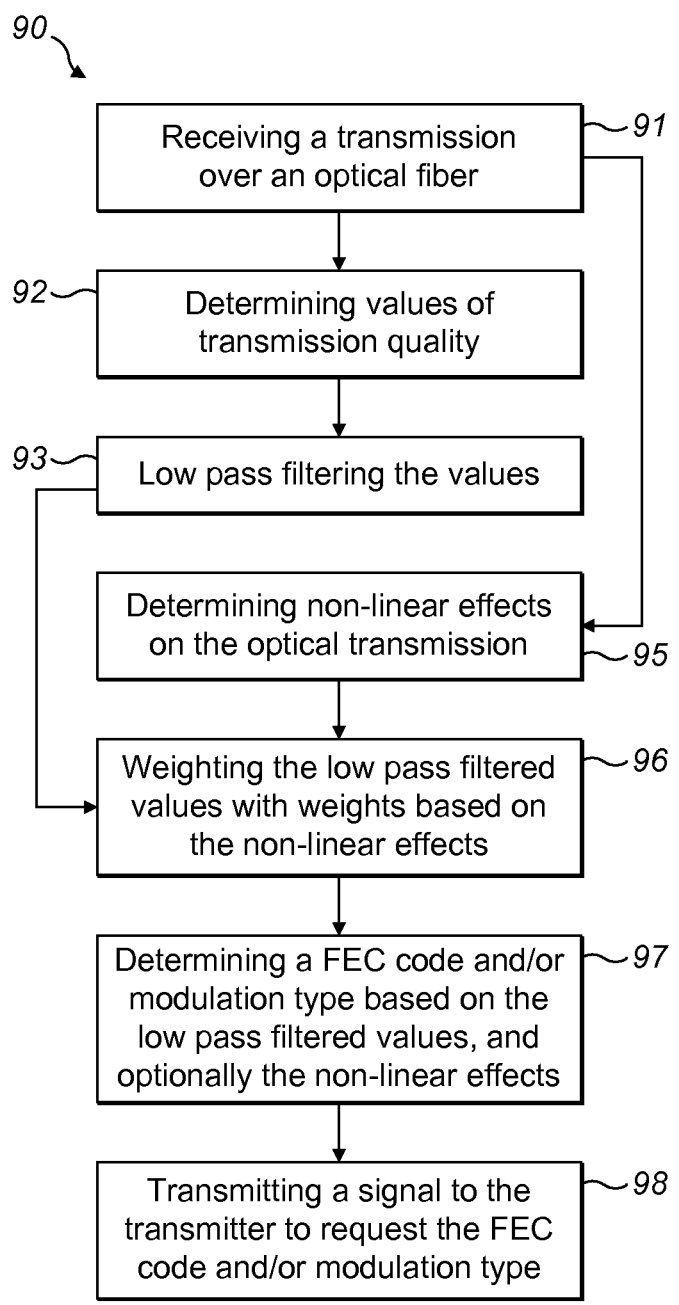
FIG. 6 is a flowchart showing a method according to a further example of the invention.

FIG. 6 shows a further example method 90 including further details. The method comprises receiving a transmission over an optical fiber, in 91. The method further comprises determining a plurality of values over time of the quality of the optical transmission, in 92. The determining is carried out in a receiver, as described above, for example, from a FEC decoder. The method further includes low pass filtering the values of quality of the transmission, in 93. The low pass filtering may be with a moving average.

In 95, the method optionally determines a non-linear effect of the optical transmission. The non-linear effects may be determined by calculating a centroid and/or variance, and considering whether a non-linear effect is shown by differences in the variance between inner and outer symbols and/or between variances along orthogonal directions, e.g. radial and azimuthal directions. In 96, the receiver, e.g. in a calculation unit, considers both the low pass filtered parameter of transmission quality and the indicator of a non-linear effect. For example, low pass filtered values are weighted with one or more weights based on the non-linear effect. Based on the low pass filtered parameter of transmission quality and the indicator of a non-linear effect, a FEC code and/or modulation type is determined in 97. In particular, a changed FEC code and/or modulation type is determined if the low pass filtered transmission quality and/or determined non-linear effect exceed one or more thresholds. The receiver transmits a signal to the transmitter to request the FEC code and/or modulation type, in 98. The receiver may transmit a signal to the transmitter only when a different FEC code and/or modulation type is required, or at a pre-determined interval even if no change is requested to the FEC code and/or modulation type.

Thus, subsequent transmissions use a different FEC code and/or modulation. The transmission may include a signal specifying the FEC code and/or modulation used.

In one example, the transmission is an optical transmission along an optical communications link. The optical transmission may comprise one or a plurality of optical carriers. In particular, the optical transmission comprises a plurality of optical carriers at spaced frequencies, e.g. frequency division multiplexed.

The optical transmission may be orthogonal or non-orthogonal. In some aspects, the receiver 1 is arranged to receive a non-orthogonal transmission, allowing improved spectral efficiency. The transmission may be time and/or frequency packed. The receiver 1 is configured to recover the resulting inter symbol interference (ISI) and/or inter carrier interference (ICI). In another example, the transmission is a faster-than-Nyquist transmission. A low order modulation format is used.

The receiver has been described as measuring a non-linearity. Alternatively, the determination of FEC code and/or modulation is based only on the low pass filtered parameter of transmission quality. The modulation block may not be included in the receiver.

The receiver has been described as comprising various units to determine quality of transmission and non-linearities, and request an adaption of a FEC code and/or modulation type. One or more of the units configured to carry out function according to aspects of the invention may be integrated with the conventional functions of the receiver, or may be connected to an apparatus configured to carry out the conventional functions of the receiver, e.g. detecting and decoding. The receiver is configured to include the components configured to carry out aspects of the invention, whether those components are integral or distributed.

The invention claimed is:

1. A receiver configured to receive an optical transmission, wherein the receiver is configured to determine a plurality of values over time of a quality of the optical transmission received at the receiver, and
   the receiver comprising one or more low pass filters configured to low pass filter the determined values of the quality of the transmission, and
   based on the low pass filtered values, the receiver is configured to determine a Forward Error Correction (FEC) code and/or modulation type for a further optical transmission, and
   wherein:
   the one or more low pass filters are downstream from one or more decoders and upstream from processing circuitry of the receiver configured to determine the FEC and/or modulation type for the further optical transmission;
   the receiver is further configured to determine non-linear effects on the optical transmission based on received symbols of the optical transmission and to determine the FEC code and/or modulation type for the further optical transmission based at least partially on the determined non-linear effects, wherein the received symbols are bypassed around the one or more low pass filters.

2. The receiver as claimed in claim 1 wherein the receiver is configured such that variations in the values of quality of transmission which are filtered out by the low pass filter are handled by a different mechanism than a change in FEC code or modulation type.

3. The receiver as claimed in claim 1 wherein the low pass filter is configured to filter out variations of quality of the transmission which occur faster than a threshold time.

4. The receiver as claimed in claim 3 wherein the threshold time is a return trip time of the transmission between the receiver and a transmitter.

5. The receiver as claimed in claim 3 wherein the threshold time is greater than 0.01 s, 0.1 s, 1 s, 1 minute, 10 minutes or 1 hour, or between 0.002 s and 10 s, or between 0.005 s and 5 s, or between 0.01 s and 1 s, or between 1 s and 1 hour, or between 1 minute and 1 hour, or between 1 minute and 10 minutes.

6. The receiver as claimed in claim 1 wherein the receiver comprises one or more FEC decoder configured to provide the values of the quality of the transmission.

7. The receiver as claimed in claim 1 wherein the receiver is configured to determine non-linear effects on the optical transmission from measurements of variance for a plurality of constellation points.

8. The receiver as claimed in claim 1 wherein the non-linear effects are determined from different values of variance for inner and outer symbols, and/or the non-linear effects are determined from different values of variance along orthogonal directions.

9. The receiver as claimed in claim 1 wherein the FEC code is determined based on both the low pass filtered values of quality of the transmission and an amount of the determined non-linear effects.

10. The receiver as claimed in claim 1 wherein the receiver is configured to determine one or more of: a changed amount of interleaving, an adaptation of the computation of a soft decision of a detector and non-linear effects compensation in the receiver, based on the determined non-linear effects.

11. The receiver as claimed in claim 1 wherein the receiver is configured to transmit a signal to a transmitter of the optical transmission, the signal requesting the determined FEC code and/or modulation type for further transmissions.

12. A method of adapting a FEC code and/or modulation type for an optical transmission, comprising:
receiving an optical transmission,
determining a plurality of values over time of a quality of the optical transmission, and
low pass filtering the values of quality of the transmission, wherein the values are low pass filtered downstream from one or more decoders and upstream from processing circuitry configured to determine the FEC and/or modulation type for a further optical transmission, and
determining non-linear effects on the optical transmission based on received symbols of the received optical transmission, wherein the received symbols bypass the low pass filtering;
based on the low pass filtered values, determining a Forward Error Correction (FEC) code and/or modulation type for the further optical transmission; and
wherein determining the FEC code and/or modulation type for further optical transmission is further based at least partially on the determined non-linear effects on the optical transmission.

13. The method as claimed in claim 12 wherein variations in the values of quality of transmission which are filtered out by the low pass filter are handled by a different mechanism than a change in FEC code or modulation type.

14. The method as claimed in claim 12 wherein the low pass filter is configured to filter out variations of quality of the transmission which occur faster than a threshold time, and optionally, wherein the threshold time is a return trip time of the transmission between the receiver and a transmitter, and/or wherein the threshold time is greater than 0.01 s, 0.1 s, 1 s, 1 minute, 10 minutes or 1 hour, or between 0.002 s and 10 s, or between 0.005 s and 5 s, or between 0.01 s and 1 s, or between 1 s and 1 hour, or between 1 minute and 1 hour, or between 1 minute and 10 minutes.

15. The method as claimed in claim 12 comprising determining non-linear effects on the optical transmission from measurements of variance for a plurality of constellation points, and optionally, determining the non-linear effects from different values of variance for inner and outer symbols, and/or determining the non-linear effects from different values of variance along orthogonal directions.

16. The method as claimed in claim 12 comprising weighting the low pass filtered values with weights based on the determined non-linear effects.

17. The method as claimed in claim 12 comprising transmitting a signal to a transmitter of the optical transmission, the signal requesting the determined FEC code and/or modulation type for further transmissions.

18. A system comprising a transmitter and receiver of an optical transmission,
the receiver configured to receive an optical transmission, wherein the receiver is configured to determine a plurality of values over time of a quality of the optical transmission received at the receiver, and
the receiver comprising one or more low pass filters configured to low pass filter the values of quality of the transmission, and
based on the low pass filtered values, the receiver is configured to transmit a signal to the transmitter of the optical transmission, the signal requesting a determined Forward Error Correction (FEC) code and/or modulation type for further transmissions;
wherein:
the one or more low pass filters are downstream from one or more decoders and upstream from processing circuitry of the receiver configured to determine the FEC and/or modulation type for the further optical transmission;
the receiver is further configured to determine non-linear effects on the optical transmission based on received symbols of the optical transmission, the symbols not filtered at the one or more low pass filters and to determine the FEC code and/or modulation type for the further optical transmission based at least partially on the determined non-linear effects, wherein the received symbols are bypassed around the one or more low pass filters.

19. A computer program product comprising computer program code operable when run on a computer, to carry out the method according to claim 12.

* * * * *